United States Patent
Kortlang

(10) Patent No.: US 9,653,835 B2
(45) Date of Patent: May 16, 2017

(54) CONTACT SYSTEM FOR PLUG-IN CONNECTIONS ON ELECTRONICS HOUSINGS

(71) Applicant: WABCO GMBH, Hannover (DE)

(72) Inventor: Tobias Kortlang, Gehrden (DE)

(73) Assignee: WABCO GmbH, Hannover (DE)

( * ) Notice: Subject to any disclaimer, the term of this patent is extended or adjusted under 35 U.S.C. 154(b) by 0 days.

(21) Appl. No.: 14/917,515

(22) PCT Filed: Jul. 17, 2014

(86) PCT No.: PCT/EP2014/001947
§ 371 (c)(1),
(2) Date: Mar. 8, 2016

(87) PCT Pub. No.: WO2015/039713
PCT Pub. Date: Mar. 26, 2015

(65) Prior Publication Data
US 2016/0218457 A1    Jul. 28, 2016

(30) Foreign Application Priority Data

Sep. 19, 2013    (DE) .......................... 10 2013 015 593

(51) Int. Cl.
*H01R 33/00* (2006.01)
*H01R 13/428* (2006.01)
(Continued)

(52) U.S. Cl.
CPC ......... *H01R 13/428* (2013.01); *H01R 12/585* (2013.01); *H01R 12/7029* (2013.01);
(Continued)

(58) Field of Classification Search
CPC  H01R 13/428; H01R 13/405; H01R 2201/26; H01R 12/7076; H01R 12/585;
(Continued)

(56) References Cited

U.S. PATENT DOCUMENTS

| 4,070,081 A * | 1/1978 | Takahashi ............ H01R 13/629 361/759 |
| 4,085,998 A * | 4/1978 | Owens ................ H01R 12/728 439/59 |

(Continued)

FOREIGN PATENT DOCUMENTS

DE    195 15 622 A1    11/1996

OTHER PUBLICATIONS

International Search Report from corresponding PCT application No. PCT/EP2014/001947 dated Oct. 17, 2014 (4 pgs).

*Primary Examiner* — Jean F Duverne
(74) *Attorney, Agent, or Firm* — Brinks Gilson & Lione

(57) ABSTRACT

A contact system for plug-in connections on electronics housings (1) for making contact with mechatronic components of motor vehicles, includes at least one contact element (13) formed of a punched part, with which contact is made on a printed circuit board (5) and which is routed out of a housing (2). For the purpose of making releasable contact with the mechatronic components, flexibly compensating for relative movements of the contacts, and allowing cost-effective production and processing without the use of special technical apparatuses, the at least one contact element (13) is designed to be fastened to a base plate (2) of the electronics housing (1) by insertion and latching, make contact with a plug-in contact (23) of a mechatronic component by way of a first contact lug (14), and make contact with the printed circuit board (5) by way of a second contact lug (20).

9 Claims, 2 Drawing Sheets

(51) Int. Cl.
   *H05K 5/00* (2006.01)
   *H01R 12/58* (2011.01)
   *H01R 12/70* (2011.01)
   *H01R 13/405* (2006.01)

(52) U.S. Cl.
   CPC ....... *H01R 12/7076* (2013.01); *H01R 13/405* (2013.01); *H05K 5/0069* (2013.01); *H01R 2201/26* (2013.01)

(58) Field of Classification Search
   CPC .. H01R 12/7029; H01R 33/09; H01R 13/629; H01R 12/728; H01R 12/58; H05K 5/0069; H05K 3/3405
   USPC .......................................................... 439/34
   See application file for complete search history.

(56) References Cited

U.S. PATENT DOCUMENTS

| | | | | |
|---|---|---|---|---|
| 4,266,714 A | * | 5/1981 | Crane | B65D 5/004 206/509 |
| 4,799,893 A | * | 1/1989 | Ogawa | H01R 12/58 439/76.2 |
| 4,857,002 A | * | 8/1989 | Jensen | H05K 1/167 338/307 |
| 4,952,529 A | * | 8/1990 | Grider | H05K 3/3405 29/836 |
| 5,236,098 A | | 8/1993 | Sadigh-Behzadi | |
| 7,204,711 B2 | * | 4/2007 | Garcia | H01R 33/09 362/249.14 |
| 2002/0055286 A1 | | 5/2002 | MacDougall | |
| 2013/0115820 A1 | | 5/2013 | Scaffidi et al. | |

* cited by examiner

CONTACT SYSTEM FOR PLUG-IN CONNECTIONS ON ELECTRONICS HOUSINGS

TECHNICAL FIELD

The invention relates to a contact system for plug-in connections on electronics housings for making contact with mechatronic components, for example control modules, solenoid valves, sensors or safety mechanisms of motor vehicles.

BACKGROUND OF THE INVENTION

DE 195 15 622 A1 discloses a control module of motor vehicles. A transmission controller of the control module comprises a base plate which is in the form of a heat sink for example, a support body which is thermally and mechanically connected to the base plate, for example, by adhesive bonding and is in the form of a printed circuit board, a thick-layer circuit arrangement which is arranged on the support body and has a large number of passive and active SMD semiconductor components which are encapsulated by means of an encapsulation compound, a housing body which surrounds the circuit arrangement for protecting the semiconductor components, a plurality of lead frames which are integrated into the housing body next to one another and one above the other and are connected to the circuit arrangement, for example, via bonding wires and can have a different number of lead frame connections, and a connection plug by means of which the transmission controller or the control module is connected to the transmission by means of connecting lines, so that the output signal from the control module or the transmission controller can be applied to the transmission as a control signal. In this case, a plurality of the lead frames serve to form a connection plug of the transmission controller, and the remaining lead frames receive and make contact with sensors and actuators. The conductive connection between the actuators and the transmission controller is established by means of making direct contact with the lead frame connections of the appropriate lead frame, which lead frame connections have fork elements/spring elements at their end.

In the case of this arrangement, plug-in forces are transferred directly to the printed circuit board. In addition, assembly is complicated since the lead frame has to be bent several times and the individual components have to be mounted with a high degree of automation. Finally, the manner of making contact with the printed circuit board is restricted to a specific production method, specifically bonding.

SUMMARY

The present disclosure provides a contact system for plug-in connections on electronics housings, which allows flexible compensation of relative movements, can be produced in a cost-effective manner, and allows simple mounting that can be carried out at different locations.

The present disclosure provides a contact system for plug-in connections on electronics housings for making contact with mechatronic components, for example control modules, solenoid valves, sensors or safety mechanisms of motor vehicles. The contact system has at least one contact element in the form of a punched part with which contact is made on a printed circuit board and that is routed out of a housing. The at least one contact element is designed to be fastened to a base plate of the electronics housing by insertion and latching, to make contact with a plug-in contact of a mechatronic component by way of a first contact lug, and to make contact with the printed circuit board by way of a second contact lug.

According to an advantageous embodiment, the at least one contact element has at least one connecting web, a first contact lug which is bent away through approximately 90° and has a cutout is formed on the contact element in relation to the at least one connecting web, contact projections which project into the cutout are formed on the first contact lug, at least one second contact lug which is bent away through approximately 90° in relation to the at least one connecting web is formed on the contact element, wherein the two contact lugs are connected by the at least one connecting web.

Therefore, the at least one contact element is a component which can be produced separately and which can be fastened to a base plate of the electronics housing by insertion and latching and which allows flexible compensation of the plug-in forces by connecting the first contact lug to the second contact lug by the connecting web. A contact element of this kind can be produced in a simple manner from a sheet metal panel as a punched part and can be mounted in the electronics housing independently of the mounting of the other components.

The at least one connecting web can be designed so as to run in a straight line between the first contact lug and the second contact lug, but preferably runs in a zigzag manner or in the form of a wave in order to allow flexibility for compensating relative movements of the contact element.

For the purpose of effective latching of the contact element to the base plate, it can be provided that latching projections which, by way of their free end, point away from the contact projections are arranged on the first contact lug.

Furthermore, it can be provided that the second contact lug is formed from two parallel contact tabs which are bent away through 90°, and that a latching area is arranged between the two contact tabs and/or latching projections which, by way of their free end, point away from the two contact tabs are arranged on either side of the two contact tabs, the latching projections likewise serving for latching to the base plate.

By way of example, the at least one-piece second contact lug is designed to make contact with the printed circuit board by pressing-in or soldering. In order to orient the contact element with respect to the printed circuit board, a recess for receiving a positioning pin is formed adjacent to the at least one-piece second contact lug of the contact element.

Irrespective of this or in interaction with the positioning pin and the recess in the contact element for receiving the positioning pin, it can be provided that, for mounting purposes, the electronics housing is inserted into an apparatus which positions the contacts by virtue of being appropriately formed in the contact region. The printed circuit board is then inserted into the electronics housing from above, and in the process is positioned above the apparatus and/or the electronics housing and pressed into the electronics housing.

The contact element is latched to the base plate in such a way that the base plate has a contact holder for receiving the first contact lug of the contact element, the contact holder being arranged on a face of the base plate which is opposite an insertion bevel for a plug-in contact. A first pull-out prevention element is arranged on the base plate adjacent to the contact holder. The latching projections of the pull-out prevention element extend over the latching projections on the first contact lug, and a second pull-out prevention element with at least one latching catch is formed on the base plate for the second contact lug of the contact element, the latching catch extending over the latching area and/or the two latching projections on the second contact lug.

Depending on the manner in which the electronics housing is designed, the first contact lug and the at least one-piece second contact lug can be bent away through approximately 90° in the direction toward the printed circuit board in the same sense, or the first contact lug can be designed to be bent away through approximately 90° opposite to the printed circuit board opposite to the at least one-piece second contact lug.

Further aspects of the invention are explained in greater detail below by means of preferred illustrative embodiment with reference to the attached drawings. The drawings are provided for purely illustrative purposes and are not intended to limit the scope of the present invention.

BRIEF DESCRIPTION OF THE DRAWINGS

The invention will be explained further below with reference to the drawings, in which.

DETAILED DESCRIPTION OF THE DRAWINGS

Figure 1:
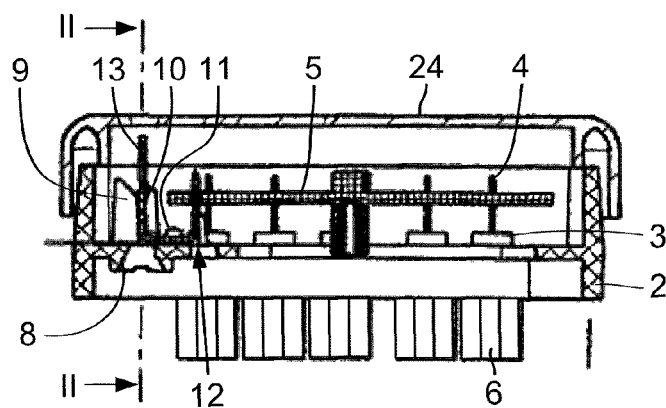
FIG. 1 shows a cross section through an electronics housing in the region of a contact element according to the contact system of the invention.
Figure 2:
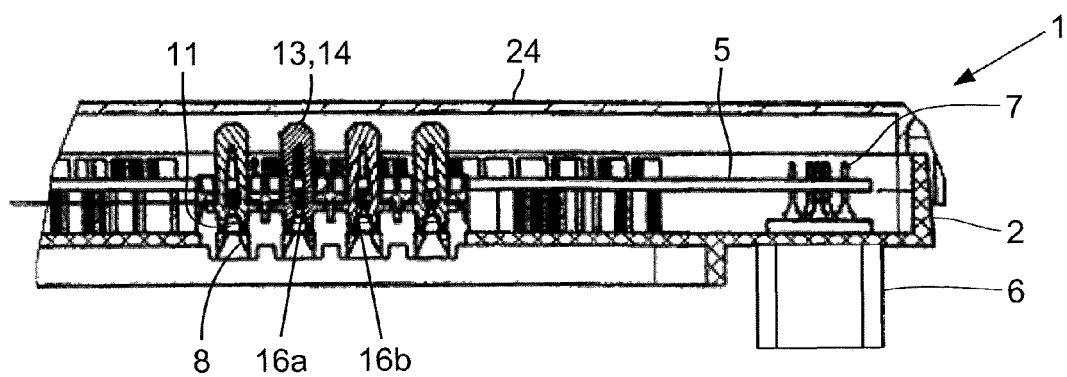
FIG. 2 shows a longitudinal section through the electronics housing according to FIG. 1 along line II-II.

The electronics housing 1 illustrated in FIGS. 1 and 2 has a base plate 2 on which various electronics elements 3 are arranged, and also has a housing cover 24 which closes off the electronics housing 1 in a hermetically sealed manner. The electronics elements 3 are electrically conductively connected by contact pins 4 to a printed circuit board 5, which is arranged above it, by soldering in a known manner. A plug socket 6, not illustrated in detail, serves to connect the electronics elements 3 or the printed circuit board 5 to an electronic control system, not illustrated, of a motor vehicle. To this end, contact pins 7 of the plug socket 6 are electrically conductively connected to the printed circuit board 5.

Figures 4, 5:
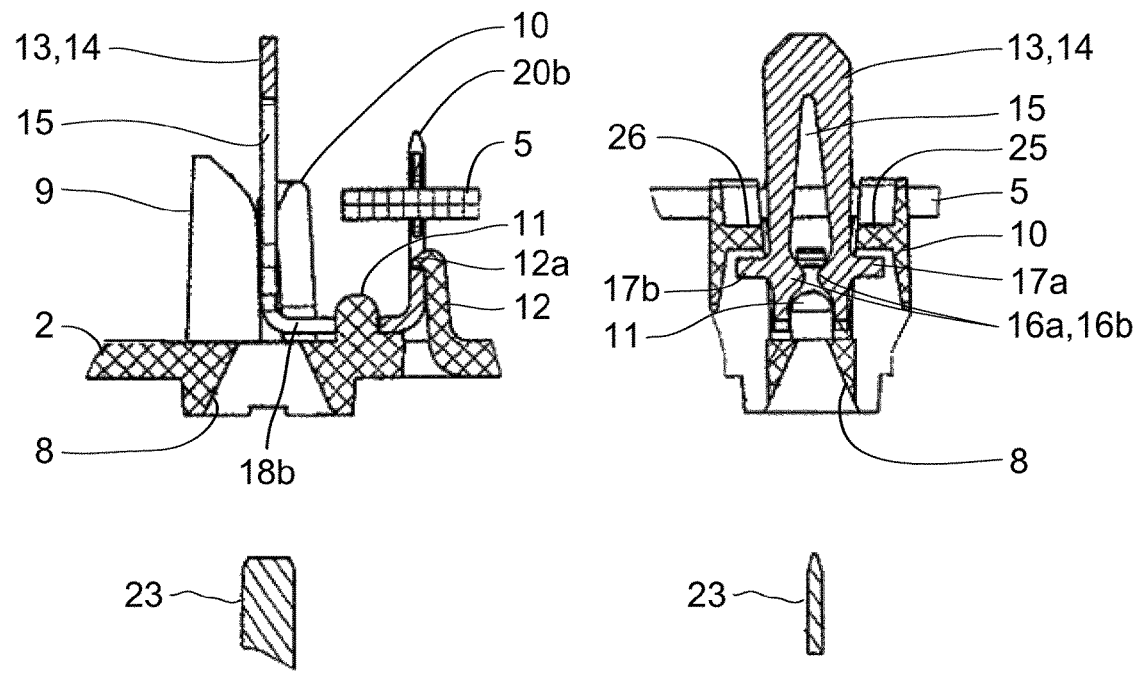
FIG. 4 is an enlarged partial sectional view through the electronics housing according to FIG. 1 in the region of a contact element according to FIGS. 1 to 3.
FIG. 5 shows an enlarged partial sectional view through the electronics housing according to FIG. 2 in the region of a contact element according to FIGS. 1 to 4.
Figure 6:
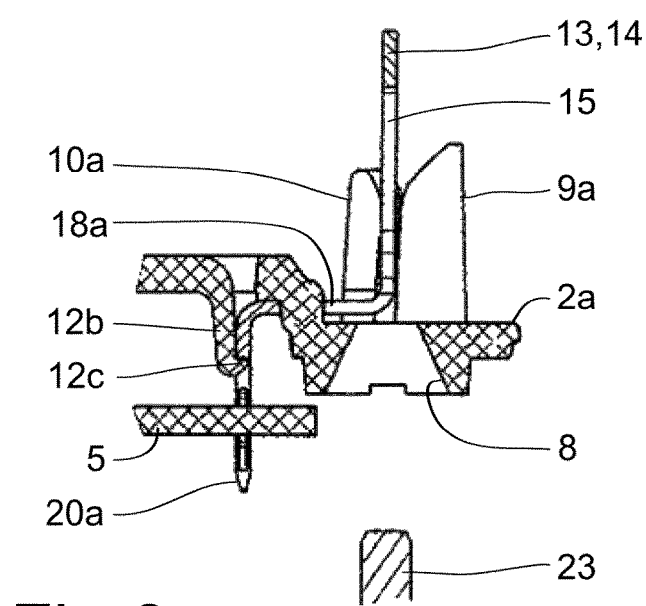
FIG. 6 shows an enlarged partial sectional view of the electronics housing with a contact element, which is formed according to the invention, in a second embodiment.

A plurality of insertion bevels 8 for receiving plug-in contacts 23, schematically illustrated in FIGS. 4 to 6, that are formed on mechatronic components with which contact is to be made are provided on the bottom face of the base plate 2. The mechatronic components are themselves not illustrated. A contact holder 9 and, adjacent to it, a first pull-out prevention element 10, a positioning pin 11, and a second pull-out prevention element 12, preferably composed of the same material as the base plate 2, are arranged on that face of the base plate 2 which faces the printed circuit board 5.

The first pull-out prevention element 10 on the base plate 2 has latching projections 25, 26 which, by way of their free ends, are directed radially toward one another while maintaining a spacing and serve to hold a first contact lug 14 of a contact element 13 on the base plate 2. The second pull-out prevention element 12 on the base plate 2 has at least one latching catch 12a that serves to latch and position the contact element 13 which is produced from metal as a punched part. As shown in the perspective illustration in FIG. 3, the contact element 13 has a first contact lug 14 which is bent away through 90° and is provided with a cutout 15 through which two contact projections 16a, 16b project, it being possible for the plug-in contact 23 to be electrically conductively clamped between the contact projections 16a, 16b. Opposite to the two contact projections 16a, 16b, two latching projections 17a, 17b are arranged on the first contact lug 14, the latching projections 25, 26 on the first pull-out prevention element 10 extending over the latching projections, as illustrated in FIG. 5 in particular.

Figure 3:
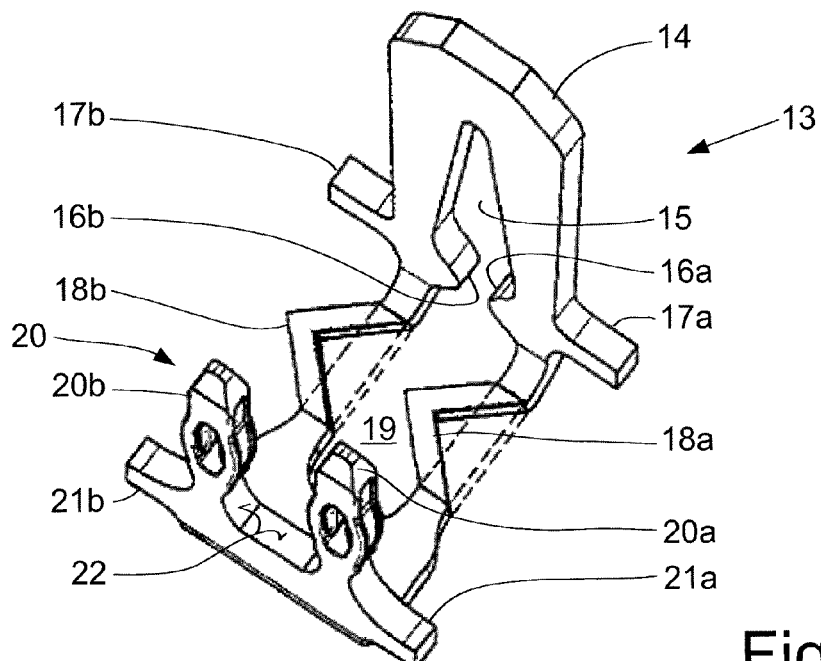
FIG. 3 is an enlarged perspective illustration of a contact element according to a first embodiment.

The exemplary embodiment, illustrated in FIG. 3, of the contact element 13 shows that the second contact element 20 thereof is formed from two contact tabs 20a, 20b which are arranged parallel to one another and are designed in a manner bent away through 90° and parallel to the first contact lug 14 on the contact element 13.

The first contact lug 14 and the two contact tabs 20a, 20b are connected by two connecting webs 18a, 18b, so that the entire contact element 13 is formed from the first contact lug 14, the two connecting webs 18a, 18b and the two-part second contact lug 20 with its two contact tabs 20a, 20b. The two connecting webs 18a, 18b are of zigzag design in order to make the connection between the first contact lug 14 and the two contact tabs 20a, 20b of the second contact lugs 20 flexible. A further embodiment with straight connecting webs is illustrated using dashed lines. It is likewise possible to design the connecting webs 18a, 18b to be bent or undulating in order to achieve the respectively desired degree of flexibility.

A latching area 22 for the latching catch 12a is provided on the second pull-out prevention element 12 between the pair of connecting webs 18a, 18b of the second contact lug 20. Also illustrated are laterally protruding latching projections 21a, 21b which run approximately in the same direction as the latching projections 17a, 17b on the first contact lug 14 which can likewise be arranged parallel to the illustrated second pull-out prevention element 12 by latching catches, similar to the latching catch 12a on corresponding pull-out prevention elements.

As shown in FIGS. 4 and 5, the contact element 13 can latch with the base plate 2 also from above and, in the process, is positioned by a positioning pin 11 on the base plate 2. To this end, the positioning pin 11 engages into a positioning recess 19 which is formed adjacent to the connecting webs 18a, 18b (FIG. 3). The printed circuit board 5 is then mounted onto the base plate 2 from above, wherein the contact pins 4 of the electronics elements 3 and the contact tabs 20a, 20b are routed through corresponding openings in the printed circuit board 5 and make contact with the printed circuit board by a press-in process or by additional soldering.

FIGS. 1 to 5 show that contact is made with the first contact lug 14 by way of the plug-in contact 23 on a mechatronic component from the bottom face of the base plate 2, wherein the top face of the base plate 2 faces the interior of the electronics housing 1 and is covered by the housing cover 24. In this embodiment, the first contact lug 14 and the pair of contact tabs 20a, 20b of the second contact lugs 20 are bent away through 90° in the same sense and parallel to one another.

FIG. 6 shows a further embodiment in which the first contact lug 14 and the pair of contact tabs 20a, 20b of the second contact lugs 20 are directed opposite one another and are bent away in parallel through 90°. In this case, the base plate 2a for latching the contact element 13 is designed in the manner illustrated in FIG. 6, wherein the base plate 2a is arranged between two opposite housing covers, not illustrated. In this case, the first contact lug 14 is arranged on the top face of the base plate 2a between a first contact holder 9a and a first pull-out prevention element 10a. The second contact lug 20; 20a, 20b which is of two-piece design is routed through an opening, not visible, in the base plate 2a to the bottom face of the base plate. A second pull-out prevention element 12b is arranged on the bottom face of the base plate 2a, the latching catch 12c of the pull-out prevention element engaging into the second contact lug 20; 20a, 20b. It can be seen with this design that the printed circuit board 5 is positioned on the bottom face of the base plate 2a and the second contact lug 20; 20a, 20b makes contact with the printed circuit board on the bottom face.

The contact system according to the invention for plug-in connections on electronics housings allows contact to be made with mechatronic components in a flexible manner ensuring flexible compensation of relative movements of the contact, cost-effective manufacturing, and the option of processing at different locations without using special technical apparatuses.

All of the features mentioned in the description of figures above, in the claims and in the introductory part of the description can be used both individually and in any desired combination with one another. Therefore, the invention is not restricted to the described and claimed combinations of features, but rather all combinations of features are considered to be disclosed.

While the above description constitutes the preferred embodiments of the present invention, it will be appreciated that the invention is susceptible to modification, variation and change without departing from the proper scope and fair meaning of the accompanying claims.

What is claimed is:

1. A contact system for plug-in connections on electronics housings (1) for making contact with a mechatronic component of a motor vehicle, the contact system comprising a housing (1) and at least one contact element (13) formed of a punched part, with which contact is made on a printed circuit board (5) and which is routed out of the housing (2) wherein the at least one contact element (13) is configured to fastened to a base plate (2) of the housing (1) by insertion and latching, make contact with a plug-in contact (23) of the mechatronic component by way of a first contact lug (14), and make contact with the printed circuit board (5) by way of a second contact lug (20; 20a, 20b), wherein the at least one contact element (13) has at least one connecting web (18a, 18b), the first contact lug (14) is bent away through approximately 90.degree in relation to the at least one connecting web (18a, 18b) and has a cutout (15) formed on the contact element (13), wherein contact projections (16a, 16b) which project into the cutout (15) are formed on the first contact lug (14), at least one second contact lug (20; 20a, 20b) is bent away through approximately 90.degree in relation to the at least one connecting web (18a, 18b) is formed on the contact element (13), and wherein the two contact lugs (14; 20; 20a, 20b) are connected by the at least one connecting web (18a, 18b),
wherein a first pair of latching projections (17a, 17b) extending away from the contact projections (16a, 16b) are arranged on the first contact lug (14).

2. The contact system as claimed in claim 1, wherein the at least one connecting web (18a, 18b) is arranged in a zigzag manner between the first contact lug (14) and the second contact lug (20; 20a, 20b).

3. The contact system as claimed in claim 1, wherein the second contact lug (20) is formed from two parallel contact tabs (20a, 20b) which are bent away through 90.degree., and a latching area (22) is arranged between the two contact tabs (20a, 20b) and a second pair of latching projections (21a, 21b) extending away from the two contact tabs (20a, 20b) are arranged on the second contact lug (20; 20a; 20b).

4. The contact system as claimed in claim 1, wherein the second contact lug (20; 20a, 20b) is configured to make contact with the printed circuit board (5) by pressing-in or soldering.

5. The contact system as claimed in claim 3, wherein the base plate (2) comprises a contact holder (9) for receiving the first contact lug (14) of the contact element (13), the contact holder being arranged on a face of the base plate (2) which is opposite to an insertion bevel (8) for the plug-in contact (23), a first pull-out prevention element (10) is arranged on the base plate (2) adjacent to the contact holder, a third pair of latching projections (25, 26) of the pull-out prevention element extending over the latching projections (17a, 17b) on the first contact lug (14), and a second pull-out prevention element (12) with at least one latching catch (12a) formed on the base plate (2) for retaining the second contact lug (20; 20a, 20b) of the contact element (13), the latching catch extending over the latching area (22) on the second contact lug (20; 20a, 20b).

6. The contact system as claimed in claim 5, wherein the first contact lug (14) and the second contact lug (20; 20a, 20b) are bent away through approximately 90.degree. in the direction toward the printed circuit board (5).

7. The contact system as claimed in claim 5, wherein the first contact lug (14) is bent away through approximately 90.degree. opposite to the printed circuit board (5) and opposite to the second contact lug ((20; 20a, 20b).

8. A contact system for plug-in connections on electronics housings (1) for making contact with a mechatronic component of a motor vehicle, the contact system comprising a housing (1) and at least one contact element (13) formed of a punched part, with which contact is made on a printed circuit board (5) and which is routed out of the housing (2) wherein the at least one contact element (13) is configured to fastened to a base plate (2) of the housing (1) by insertion and latching, make contact with a plug-in contact (23) of the mechatronic component by way of a first contact lug (14), and make contact with the printed circuit board (5) by way of a second contact lug (20; 20a, 20b), wherein the at least one contact element (13) has at least one connecting web (18a, 18b), the first contact lug (14) is bent away through approximately 90.degree in relation to the at least one connecting web (18a, 18b) and has a cutout (15) formed on the contact element (13), wherein contact projections (16a, 16b) which project into the cutout (15) are formed on the first contact lug (14), at least one second contact lug (20; 20a, 20b) is bent away through approximately 90.degree in relation to the at least one connecting web (18a, 18b) is formed on the contact element (13), and wherein the two contact lugs (14; 20; 20a, 20b) are connected by the at least one connecting web (18a, 18b),
wherein a recess (19) for receiving a positioning pin (11) is formed in the contact element (13) adjacent to the second contact lug (20; 20a, 20b).

9. A contact system for plug-in connections on electronics housings (1) for making contact with a mechatronic component of a motor vehicle, the contact system comprising a housing (1) and at least one contact element (13) formed of a punched part, with which contact is made on a printed circuit board (5) and which is routed out of the housing (2) wherein the at least one contact element (13) is configured to fastened to a base plate (2) of the housing (1) by insertion and latching, make contact with a plug-in contact (23) of the mechatronic component by way of a first contact lug (14), and make contact with the printed circuit board (5) by way of a second contact lug (20; 20*a*, 20*b*), wherein the at least one contact element (13) has at least one connecting web (18*a*, 18*b*), the first contact lug (14) is bent away through approximately 90.degree in relation to the at least one connecting web (18*a*, 18*b*) and has a cutout (15) formed on the contact element (13), wherein contact projections (16*a*, 16*b*) which project into the cutout (15) are formed on the first contact lug (14), at least one second contact lug (20; 20*a*, 20*b*) is bent away through approximately 90.degree in relation to the at least one connecting web (18*a*, 18*b*) is formed on the contact element (13), and wherein the two contact lugs (14; 20; 20*a*, 20*b*) are connected by the at least one connecting web (18*a*, 18*b*), wherein the at least one connecting web (18*a*, 18*b*) is arranged in a straight line between the first contact lug (14) and the second contact lug (20; 20*a*, 20*b*).

\* \* \* \* \*